United States Patent

Schweighofer

[11] Patent Number: 6,034,565
[45] Date of Patent: Mar. 7, 2000

[54] POWER AMPLIFIER FOR USE IN AN NMR TOMOGRAPHY APPARATUS

[75] Inventor: Peter Schweighofer, Nuremberg, Germany

[73] Assignee: Siemens Aktiengesellschaft, Munich, Germany

[21] Appl. No.: 09/119,969

[22] Filed: Jul. 21, 1998

[30] Foreign Application Priority Data

Jul. 23, 1997 [DE] Germany ............ 197 31 690

[51] Int. Cl.$^7$ .............. H03F 3/38; H03F 3/217
[52] U.S. Cl. ........................... 330/10; 330/251
[58] Field of Search .................. 330/10, 207 A, 330/251

[56] References Cited

U.S. PATENT DOCUMENTS

| | | |
|---|---|---|
| 4,337,438 | 6/1982 | Guggenbuhl et al. .......... 330/10 |
| 4,628,264 | 12/1986 | Rzedzian . | |
| 5,245,287 | 9/1993 | Nowak et al. . | |
| 5,442,317 | 8/1995 | Stengel ............ 330/10 |
| 5,541,604 | 7/1996 | Meier ............ 342/42 |
| 5,747,942 | 5/1998 | Ranganath ........ 315/224 |

FOREIGN PATENT DOCUMENTS

| | | |
|---|---|---|
| 0 076 054 | 6/1986 | European Pat. Off. . |
| 0 227 441 | 7/1987 | European Pat. Off. . |

*Primary Examiner*—Robert Pascal
*Assistant Examiner*—Patricia Nguyen
*Attorney, Agent, or Firm*—Hill & Simpson

[57] ABSTRACT

A power amplifier has an amplifier assembly and a resonant assembly with a resonant capacitor and a control element. A parallel resonant circuit can be formed by the resonant capacitor and a load that can be connected to the amplifier. An output voltage or an intermediate circuit voltage of the amplifier can be applied at the resonance capacitor via the control element. An NMR tomography apparatus has at least one such power amplifier. The power amplifier can be universally used with low components outlay and is able to generate a number of signal forms.

19 Claims, 2 Drawing Sheets

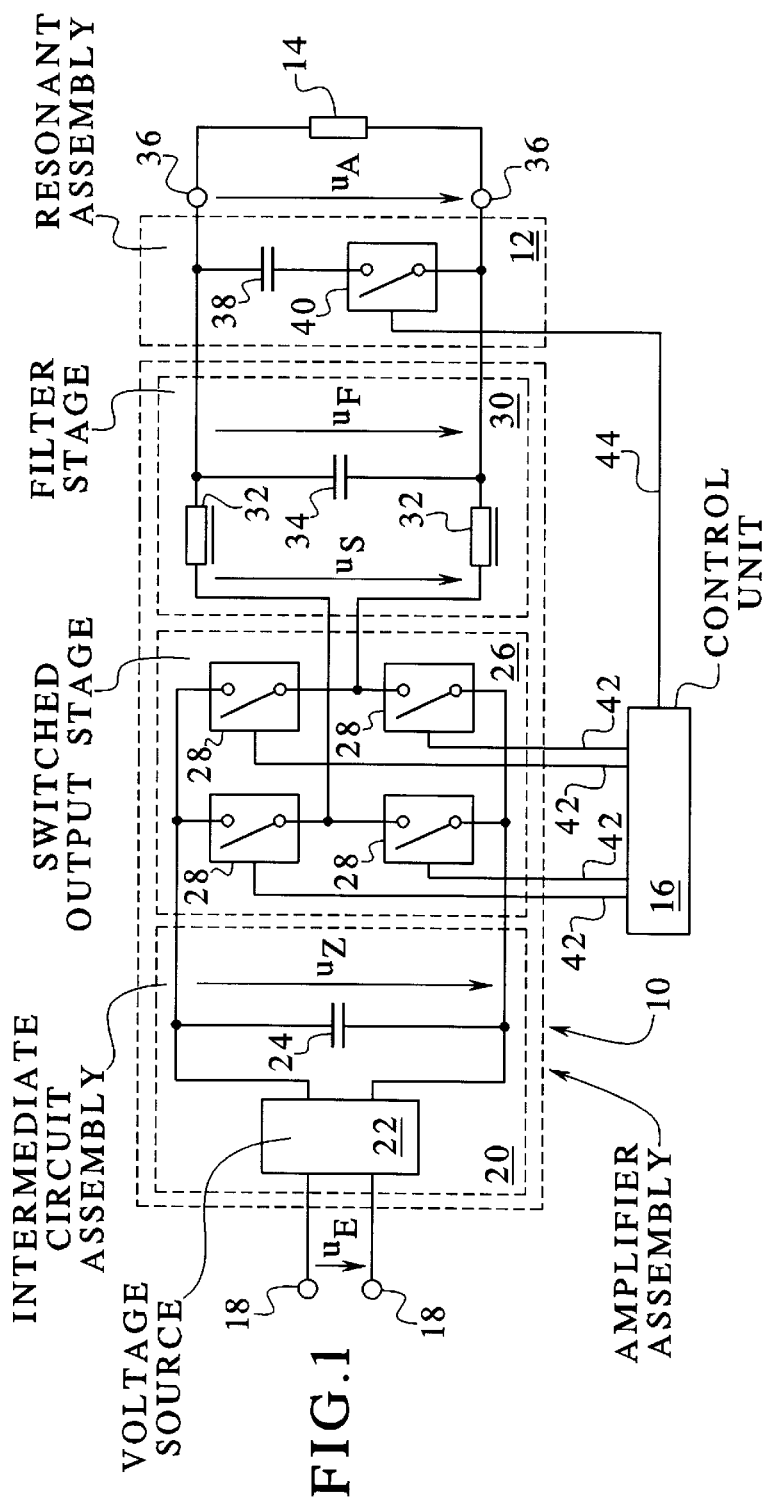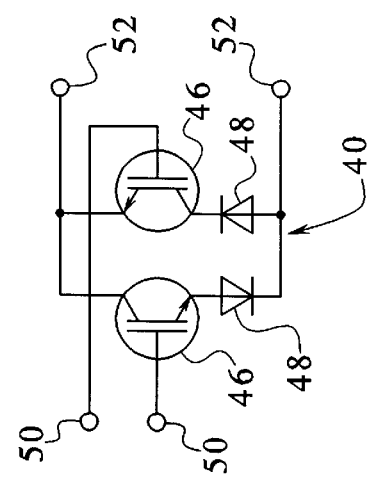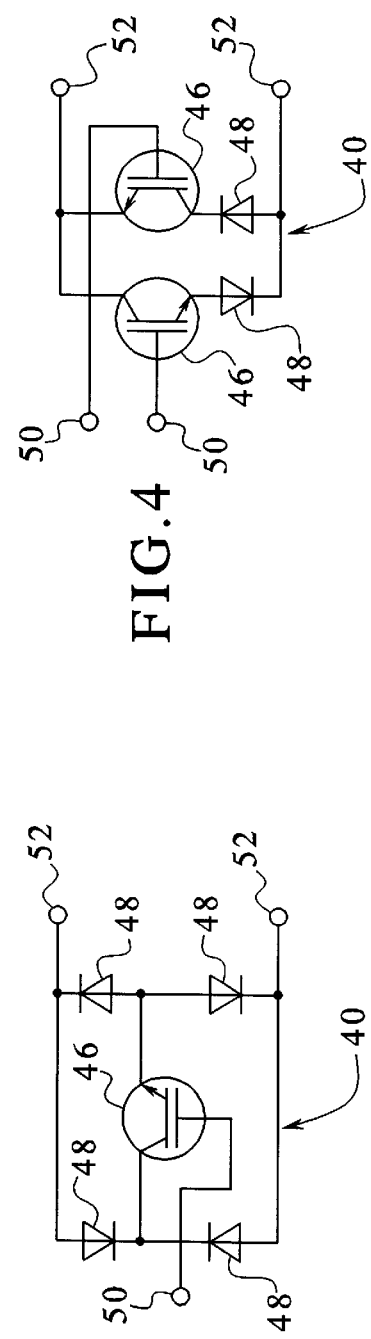

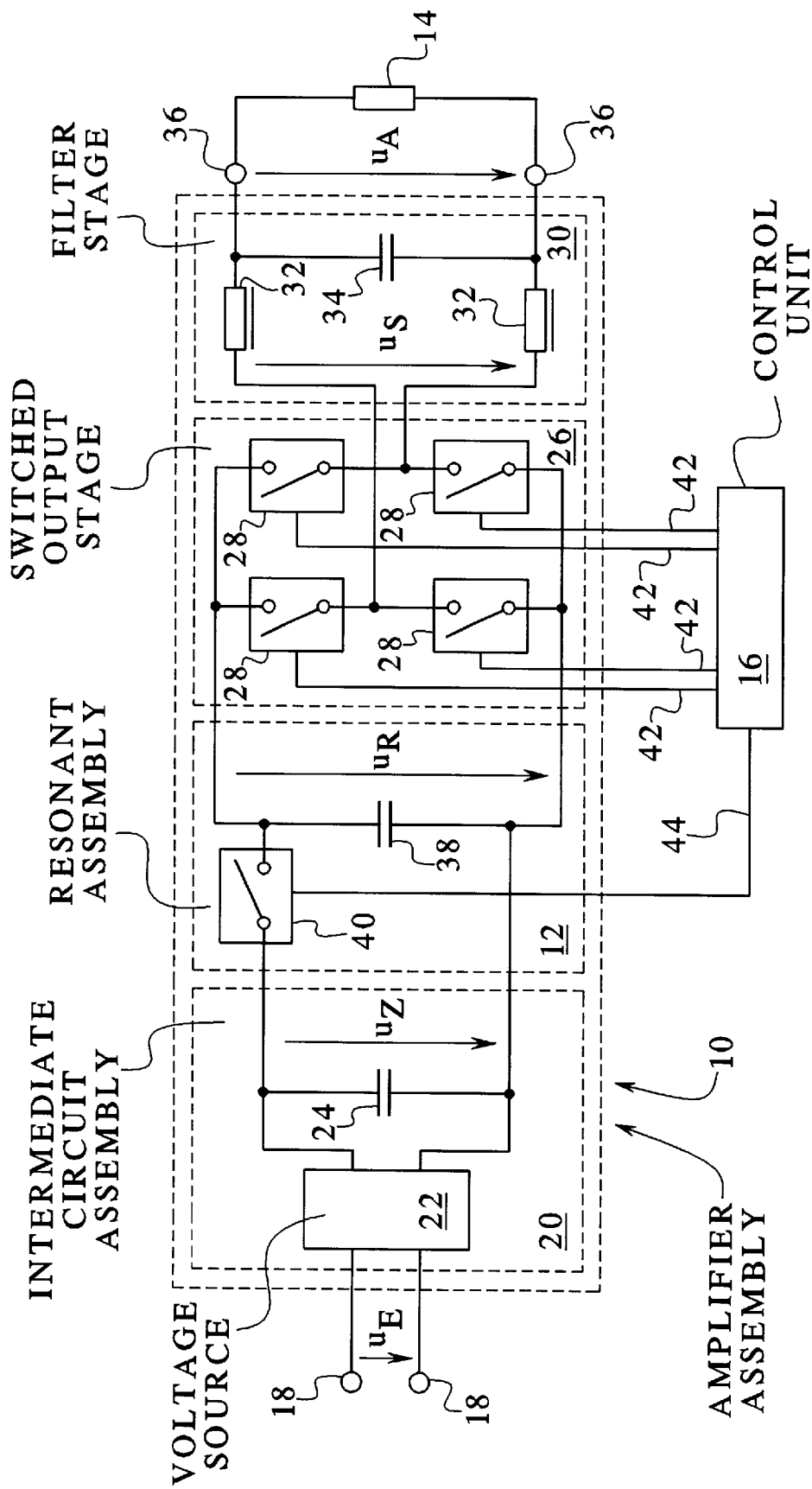

POWER AMPLIFIER FOR USE IN AN NMR TOMOGRAPHY APPARATUS

BACKGROUND OF THE INVENTION

1. Field of the Invention

The present invention is directed to a power amplifier of the type suitable for use in an NMR tomography apparatus, the power amplifier being of the type having a voltage source and a resonant assembly connected in parallel with the voltage source, the resonant assembly including a resonant capacitor connected in series with a control element.

2. Description of the Prior Art

An NMR tomography apparatus usually has three gradient coils in which precisely controlled periodic currents flow. The current behavior curve is dependent on the imaging method used. In a high-speed method, for example, as the EPI (echoplanar) method, it is particularly necessary to generate very steep and rapid consecutive leading and trailing edges of current. It thus can be necessary to build up and dismantle a current flow of 200 A in a gradient coil (with an inductivity of 1 mH, e.g.) within time intervals of 0.5 ms. The EPI method is described in detail in European Application 0 076 0054.

To satisfy these high demands, it is known to use a resonant circuit formed of the gradient coil and a capacitor. The gradient currents are sinusoidal at least in sections thereof.

European Application 0 227 411 discloses a gradient amplifier of the general type initially described. A gradient coil is arranged in a shunt arm of a circuit bridge. A resonant capacitor is connected in parallel with the circuit bridge via a switch element. A constant voltage is applied at the circuit bridge via a diode.

U.S. Pat. No. 4,628,264 discloses a gradient amplifier wherein a resonant capacitor and a gradient coil form a parallel resonant circuit. A switch element or a switch bridge is arranged in the resonant circuit in order to separate or change the polarity of the connection between the resonant capacitor and the gradient coil. Amplifiers which are permanently connected with the resonant capacitor are provided for compensating losses during the resonant oscillations.

German OS 41 27 529 discloses a gradient amplifier wherein a resonant capacitor is arranged in a shunt arm of a switch bridge. The switch bridge, a gradient coil and an amplifier assembly together form a serial resonant circuit. In the operation of the gradient amplifier, the amplifier assembly serves to generate individual sections of each gradient pulse in a non-resonant fashion.

The circuits according to European Application 0 227 411 and the U.S. Pat. No. 4,628,264 are able to generate only a limited number of different current profiles. Thus these circuits are not universally usable. Moreover, the embodiments with switch bridges result in a high component outlay. The circuit proposed in German OS 41 27 529 is likewise very expensive, because another switch bridge is required in addition to a complete amplifier assembly, typically constructed as a switched amplifier.

SUMMARY OF THE INVENTION

It is an object of the present invention to provide a power amplifier suitable for use in an NMR tomography apparatus which avoids the aforementioned problems associated with the prior art and which can by universally with a low outlay for components and which is able to generate a number of signal forms.

The above object is achieved in accordance with the principles of the present invention in a power amplifier, particularly a gradient amplifier for an NMR tomography apparatus, having an amplifier assembly forming a voltage source, a resonant assembly connected in parallel with the amplifier assembly forming the voltage source and including a resonant capacitor connected in series with a control element, wherein the amplifier assembly and the resonant assembly operate in combination to generate an output voltage of the power amplifier.

The above object is also achieved in a power amplifier constructed in accordance with the invention, particularly a gradient amplifier for an NMR tomography apparatus, having an intermediate circuit assembly which generates an intermediate circuit voltage, a resonant assembly including a resonant capacitor and a control element operable to connect and disconnect the resonant capacitor across the intermediate circuit voltage, and a switched output stage connected across the resonant capacitor, the switched output stage being configured to provide a switched output stage voltage by means of pulse-width modulation in a first mode of the power amplifier, this switched output stage voltage being employed in the generation of the output voltage. The switched output stage is also operable in a second mode of operation of the power amplifier to form a parallel resonant circuit between the resonant capacitor and a load which can be connected to the power amplifier.

A power amplifier is inventively created which is able to generate a number of different current forms and is particularly capable for EPI. Components are saved, inasmuch as the invention uses a parallel resonant circuit at which either an output current or an intermediate circuit current of the amplifier assembly can be applied. The inventive amplifier thus can be produced particularly cost-effectively. The invention can be used in all types of power amplifiers. Besides gradient amplifiers, these are power amplifiers used in devices for inductive heating, in particular.

As used herein the term "output voltage of the power amplifier," means a voltage which can be attached to a load without intermediate circuit of other switch components of the power amplifier. This does not mean, however, that the output voltage of the amplifier would have to be directly across the load. For example, a number of amplifiers can be coupled and connected together to the load, or a filtering circuit can be provided within the amplifier or between the amplifier and the load.

The amplifier assembly is preferably constructed as high-value power amplifier which is able to supply the load with a desired current in a first, non-resonant mode. Such an amplifier assembly generates the output current preferably by pulse-width modulation by means of a switched output stage. A second, resonant mode is preferably further provided in which a resonant oscillation and/or a temporary over-voltage occurs through resonance.

In the first, non-resonant mode the resonant capacitor of the resonant circuit preferably has no effect. It can then be decoupled from the power amplifier or connected to a much larger buffer capacitor. In one embodiment the resonant capacitor has a capacity of 1 $\mu$F to 100 $\mu$F, preferably 10 $\mu$F.

In the second, resonant mode, a parallel resonant circuit is formed between the load and the resonance capacitor by the insertion of a control element and/or by the insertion of the switch output stage. In these embodiments, in the second mode only the control element or only the switched output stage or both have the resonant current flowing therein.

To enable an immediate oscillating action, a circuit for pre-charging the resonant capacitor is preferably provided.

In one embodiment of the amplifier the intermediate circuit assembly serves this purpose.

The control element is preferably constructed as an electronic switch which can be dependent or independent of the current direction. In alternative embodiments, the control element can act as an electronically controllable resistor. The control element preferably includes one or more MOSFETs (MOS-Field Effect Transistors) or IGBTs (insulated gate bipolar transistors) and possibly one or more diodes.

In a preferred embodiment, a filtering circuit is provided to filter the output voltage of the power amplifier. This is particularly the case if a pulse-width-modulated signal serves to generate the output voltage in the non-resonant mode. The filtering circuit preferably has a filtering frequency (cut-off frequency) which is lower than the switch frequency of the switch output stage by a factor of 0.5 to 0.8. For example, the filter frequency can equal 30 kHz given a switch frequency of 50 kHz.

In an NMR tomography apparatus, the inventive power amplifier preferably serves as the power supply of a gradient coil. In preferred embodiments, in order to achieve particularly strong voltages or currents, amplifier arrangements are provided which are connected in series or in parallel at the output side and which include an inventive power amplifier. Such an amplifier arrangement preferably further contains at least one amplifier means which does not have its own resonant assembly (base amplifier) and/or at least one optionally connectable constant-voltage source.

DESCRIPTION OF THE DRAWINGS

FIG. 1 is a block diagram of a first exemplary embodiment of a power amplifier constructed in accordance with the invention, with a connected load.

FIG. 2 is a block diagram of a second exemplary embodiment of a power amplifier constructed in accordance with the invention, with a connected load.

FIG. 3 shows a first embodiment of a control element for use in the inventive power amplifier.

FIG. 4 shows a second embodiment of a control element for use in the inventive power amplifier.

DESCRIPTION OF THE PREFERRED EMBODIMENTS

In the power amplifier depicted in FIG. 1 which is configured as gradient amplifier of an NMR tomography apparatus, an amplifier assembly 10 serving as a voltage source and a resonant assembly 12 are connected in sequence and are connected to a gradient coil which forms a predominantly inductive load 14. A control unit 16 is further provided for controlling all the components of the power amplifier.

An input voltage $u_E$, e.g. a line voltage, is connected at an intermediate circuit assembly 20 of the amplifier assembly 10 via input terminals 18. The intermediate voltage source 22 generates a constant intermediate circuit voltage $u_Z$ from the input voltage $u_E$, this intermediate circuit voltage being across a buffer capacitor 24 serving to flatten smooth the voltage.

A switched output stage 26 of the amplifier assembly 10 has four switch components 28 in a bridge arrangement. The switch components 28 are constructed as power MOSFETS, each having a recovery diode. The switch components 28 are arranged in two series-connected pairs, each having the intermediate circuit $u_Z$ thereacross. At the shunt arm of the bridge—i.e. at the respective junctions of the two switch components 28 in the pairs—an output $u_S$ is tapped, which serves as an input voltage for a filtering stage 30 of the amplifier assembly.

The filtering stage 30 is a low-pass filter with a cutoff frequency of about 30 kHz and has two inductors 32 via which the output stage voltage $u_S$ is applied across a filtering capacitor 34 in order to generate a filtered voltage $u_F$. As the output voltage $u_A$ of the entire power amplifier, the voltage $u_F$ is directly across two output terminals 36 and the load 14.

The resonant assembly 12 is connected in parallel with the filtering capacitor 34 and the load 14, so that the output voltage $u_A$ is likewise across at the resonant assembly 12, or is generated in a resonant mode by the resonant assembly 12 in cooperation with the load 14. The resonant assembly 12 contains a resonant capacitor 38 with a capacitance of approximately 10 $\mu F$ which is connected in series with a control element 40. The resonant capacitor 38 can be applied at the load 14 and separated therefrom by means of the control element 40, whose construction will be described.

The control unit 16 is connected with the four switch components 28 via four respective lines 42 is connected to the control element 40 via a control line 44. The power amplifier according to FIG. 1 can function in many different modes as well as in one of several stages.

In a first, non-resonant mode the control element 40 is highly resistive, so that the resonant capacitor 38 is decoupled and does not exert any influence. The output voltage $u_A$ is generated in known fashion in that the switch output stage 26 generates a precisely controlled output stage voltage $u_S$ from the intermediate circuit voltage uZ by pulse-width modulation. A residual ripple is filtered out by the filtering stage 30, and the filtered voltage $u_F$ is across the load 14 as an output voltage $u_A$.

In a second, resonant mode the control element 40 conducts, so that the parallel resonant circuit formed by the resonant capacitor 38 and the load 14 is closed, and a sinusoidal, resonant oscillation arises. The switch components 28 of the switched output stage 26 are discharged, because the actual oscillating current flows outside the switched output stage 26. The switched output stage 26 can assume a highly resistive state if, for example, all switch components 28 are in a blocking state. In this case, the resonant oscillation is relatively free, and the output stage voltage $u_S$ is generated by the resonant circuit and not by the switched output stage 26. Alternatively, the two series inductances 32 can be connected to each other with low resistivity via the switched output stage 26, so that the resonant oscillation is influenced by the filtering stage 30, but not by the output voltage $u_S$ generated by the switched output stage 26.

Instead of a pure resonant operation, the control unit 16 can further assume a mode in which the resonant capacitor 38 is connected, and a mode wherein the output stage voltage $u_S$ generated by the switched output stage 26 influences the resonant oscillation. The effect of the switched output stage 26 can be variably strong. Thus the switched output stage 26 can be used to modify the sinusoidal current profile of the resonant oscillation or to compensate an attenuation of the resonant oscillation through losses (for example, at the ohmic resistance of the load 14 or at the control element 40).

Finally, modes are also possible in which the current flow through the load 14 is generated predominantly by the switched output stage 26, and the control element 40 forms a larger or smaller resistance. The resonant capacitor 38 can thus be pre-charged to a desired voltage which cannot however exceed the output voltage $u_A$. In an alternative embodiment of the circuit of FIG. 1, a divided pre-charging circuit can be provided for the resonant capacitor 38, with which circuit higher pre-charging voltages can also be generated.

As a whole, the circuit according to FIG. 1 enables arbitrary mixtures of resonant and non-resonant modes; particularly also those in which a rapid chronological change occurs. For example, it is possible to generate only a small section of the current profile in a resonant fashion (e.g. only a subsection of a quarter-wave having a particularly strong rise) and to generate the remaining sections in a non-resonant fashion.

The power amplifier depicted in FIG. 2 is constructed similarly to the amplifier according to FIG. 1, as described above. The amplifier according to FIG. 2 differs itself from the amplifier according to FIG. 1 in that the resonant assembly 12 is connected in the intermediate circuit of the amplifier assembly 10. More specifically, the control element 40 of the resonant assembly 12 is connected in the current path running from the intermediate circuit assembly 20 to the switched output stage 26, and the resonant capacitor 38 is connected in parallel with the switched output stage 26 at the input side. Thus a resonant circuit voltage $u_R$, rather than the intermediate circuit voltage $u_Z$, is directly across the switched output stage $u_R$. In the circuit according to FIG. 2, the load 14 is connected directly to the filtering stage 30 at the output side without resonant components being connected in parallel.

In the operation according to FIG. 2, the control element 40 conducts in the first non-resonant mode. The resonant capacitor 38 is thus connected in parallel with the buffer capacitor 24—which is much larger (e.g. by a factor of 100)—so that the resonance frequency shifts into a region which can be compensated by a current regulator of the control assembly 16. The power amplifier then functions in the manner described above, whereby the oscillating current voltage uR is therein essentially the same as the intermediate circuit voltage uZ.

In the second, resonant mode, the control element 40 is highly resistive. The parallel resonant circuit formed between the resonant capacitor 38 and the load 14 is disposed between the switched output stage 26 and the filtering stage 30, which is continuously active.

In the resonant mode the switch components 28 can be controlled by the control unit 16 such that a connection is produced between a one terminal of the resonance capacitor 38 and a one output terminal 36, this connection remaining the same during this mode. In this case a free sinusoidal oscillation arises. It is also possible, however, to influence the form of oscillation by a suitable control of the switch components 28. The resonant circuit can be interrupted, for example, if the resonant capacitor 38 has reached its maximal charge and the current flow in the resonant circuit is exactly zero. A current flow can likewise be maintained in the load 14, by connecting the output terminals 36 with low resistivity via the filtering stage 30 and the switched output stage 26.

Finally, it is possible to change the polarity—time interval-by-time interval—of the allocation of the output terminals 36 to the terminals of the resonant capacitor 38 in order to generate a current flow which is rectified and which consists of sinusoidal half-waves, for example.

In the amplifier according to FIG. 2, the resonant capacitor 38 can be pre-charged to the intermediate circuit voltage uZ in order to enable a rapid and immediate commencement of oscillation. In such a third mode, the control element 40 is through-connected and the connection between the resonant capacitor 38 and the load 14 is interrupted by the opened switch components 28 in the switched output stage 26. In the circuit depicted in FIG. 2, the intermediate circuit voltage can be set in a graduated or a continuous fashion in order to make available various pre-charging voltages, particularly those which differ from the intermediate circuit voltages uZ arising in the first mode of the power amplifier.

A combination of modes as described above with reference to FIG. 1 is also possible in the amplifier according to FIG. 2. In particular, in order to compensate losses or to increase the steepness of the edge of the current flow through the load 14, at suitable times in a resonant oscillation the intermediate circuit voltage $u_Z$ can be applied across the resonant capacitor 38 via the control element 40—which can have a more or less large resistance. A rapid chronological change between the modes is also possible.

FIG. 3 depicts shows an embodiment of the control element 40. An IGBT is arranged in the shunt arm of a rectifier bridge formed from four diodes 48. The gate of the IGBT 46 is connected to a control terminal 50 which is connected to the control line 44 shown in FIGS. 1 and 2. The rectifier bridge has two switch terminals 52 with which the control element 40 is connected into the circuit to be switched. Due to the rectifier bridge, it is insured that the IGBT 46 need only switch one current flow in one direction.

In the alternative embodiment of the control element according to FIG. 4, two IGBTs 46 connected with opposite polarities are provided with respective pre-charged diodes 48 and respective control terminals 50. In this embodiment, the IGBTs 46 are jointly controlled. This means that, depending on a control signal on the control line 44, the IGBTs 46 always either both conduct or both block, or both have approximately the same resistance. To this end, different drive signals must be applied at the control terminals 50, since the emitters of the IGBTs 46 are at different potentials. These drive signals are generated by a suitable circuit from the control signal on the control line 44.

In another alternative embodiment based on the circuit in FIG. 4, the two IGBTs 46 are driven separately in order to be able to define the conductive properties of the control element 40 dependent on the current direction. A power amplifier with such a control element 40 is able to generate an even larger bandwidth of various current profiles.

In the use of the control element 40 in the circuit according to FIG. 1, its components are dimensioned such that their voltage stability suffices to block the full output voltage $u_A$ in the non-resonant mode of the power amplifier, and its current loading capacity suffices to conduct the full resonant current in the resonant mode. This applies given the use of the control element 40 in the circuit according to FIG. 2, accordingly.

The power amplifier according to FIG. 2 with a control element according to FIG. 3 is presently considered by the inventor as the best mode of the inventive power amplifier. Furthermore, the inventor presently considers an NMR tomography apparatus in which an inventive power amplifier and a base amplifier are connected in series and connected to the load 14 as the best mode of the inventive NMR tomography apparatus.

Although modifications and changes may be suggested by those skilled in the art, it is the intention of the inventor to embody within the patent warranted hereon all changes and modifications as reasonably and properly come within the scope of his contribution to the art.

I claim as my invention:

1. A power amplifier comprising:
   an amplifier assembly forming a voltage source;
   a resonant assembly connected in parallel across said amplifier assembly, said resonant assembly comprising a resonant capacitor and a control element connected in series; and
   said amplifier assembly being operable for generating an output voltage of said power amplifier in a non-resonant mode of said power amplifier, and said resonant assembly being operable for generating said output voltage of said power amplifier in a resonant mode of said power amplifier.

2. A power amplifier as claimed in claim 1 wherein said amplifier assembly comprises a switched output stage comprising means for producing a switched output stage voltage by pulse-width modulation in said non-resonant mode.

3. A power amplifier as claimed in claim 2 comprising filtering means for filtering said switched output stage voltage, said filtering means being active only in said non-resonant mode.

4. A power amplifier as claimed in claim 2 comprising filtering means for filtering said switched output stage voltage, said filtering means being active only in said resonant mode.

5. A power amplifier as claimed in claim 2 comprising filtering means for filtering said switched output stage voltage, said filtering means being active both in said non-resonant and resonant modes.

6. A power amplifier as claimed in claim 1 having a pair of output terminals with said output voltage being across said pair of output terminals, said output terminals being connectable directly to a load without insertion of any other components.

7. A power amplifier as claimed in claim 2 further comprising control means for driving said control element and for driving said switched output stage.

8. A power amplifier comprising:
   an intermediate circuit assembly which generates an intermediate circuit voltage;
   a resonant assembly comprising a resonant capacitor and a control element connected across said intermediate circuit voltage, said control element being operable to connect and disconnect said resonant capacitor across said intermediate circuit voltage; and
   a switched output stage connected across said resonant capacitor, said switched output stage comprising means, in a first mode, for producing a switched output stage voltage by pulse-width modulation of said intermediate circuit voltage, said switched output stage voltage being employed for generating an output voltage, and, in a second mode, for forming a parallel resonant circuit between said resonant capacitor and a load.

9. A power amplifier as claimed in claim 8 wherein in said first mode said intermediate circuit voltage is across said resonant capacitor and in said second mode said intermediate circuit voltage is disconnected from said resonant capacitor by said control element.

10. A power amplifier as claimed in claim 8 wherein said switched output stage comprises means for conducting a resonant current in said second mode.

11. A power amplifier as claimed in claim 8 comprising means for pre-charging said resonant capacitor to said intermediate circuit voltage in a third mode.

12. A power amplifier as claimed in claim 8 having a pair of output terminals with said output voltage being across said pair of output terminals, said output terminals being connectable directly to a load without insertion of any other components.

13. A power amplifier as claimed in claim 8 wherein said control element comprises an IGBT connected in a shunt arm of a diode bridge.

14. A power amplifier as claimed in claim 8 wherein said control element comprises two IGBTs connected in parallel with opposite polarity.

15. A power amplifier as claimed in claim 8 comprising filtering means for filtering said switched output stage voltage, said filtering means being active only in said first mode.

16. A power amplifier as claimed in claim 8 comprising filtering means for filtering said switched output stage voltage, said filtering means being active only in said second mode.

17. A power amplifier as claimed in claim 8 comprising filtering means for filtering said switched output stage voltage, said filtering means being active both in said first and second modes.

18. A power amplifier as claimed in claim 8 further comprising control means for driving said control element and for driving said switched output stage.

19. A power amplifier comprising:
   an amplifier assembly forming a voltage source;
   a resonant assembly connected in parallel across said amplifier assembly forming a voltage source, said resonant assembly comprising a resonant capacitor and a control element connected in series;
   said amplifier assembly and said resonant assembly, in combination, comprising means for generating an output voltage; and
   said control element being a control element selected from the group consisting of an IGBT connected in a shunt arm of a diode bridge, and two IGBTs connected in parallel with opposite polarity.

* * * * *